United States Patent
Chang

(10) Patent No.: US 7,732,123 B2
(45) Date of Patent: Jun. 8, 2010

(54) IMMERSION PHOTOLITHOGRAPHY WITH MEGASONIC RINSE

(75) Inventor: Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 695 days.

(21) Appl. No.: 10/995,653

(22) Filed: Nov. 23, 2004

(65) Prior Publication Data

US 2006/0110689 A1    May 25, 2006

(51) Int. Cl.
G03F 7/26    (2006.01)
(52) U.S. Cl. ..................................... 430/322
(58) Field of Classification Search ................. 430/322, 430/327; 427/560
See application file for complete search history.

(56) References Cited

U.S. PATENT DOCUMENTS

| | | | |
|---|---|---|---|
| 4,480,910 A | | 11/1984 | Takanashi et al. |
| 4,509,852 A | | 4/1985 | Tabarelli et al. |
| 5,783,790 A | | 7/1998 | Mitsumori et al. |
| 5,900,354 A | | 5/1999 | Batchelder |
| 5,911,837 A | | 6/1999 | Matthews |
| 6,496,257 B1 | | 12/2002 | Taniguchi et al. |
| 6,517,665 B1 * | 2/2003 | Boehme et al. ......... 156/345.11 |
| 6,562,550 B2 * | 5/2003 | Takahata et al. ............ 430/320 |
| 6,754,980 B2 | | 6/2004 | Lauerhaas et al. |
| 7,056,646 B1 * | 6/2006 | Amblard et al. ............. 430/311 |
| 7,110,081 B2 * | 9/2006 | Hoogendam et al. .......... 355/30 |
| 2001/0047810 A1 * | 12/2001 | Farber et al. ................. 134/1.3 |
| 2003/0068837 A1 * | 4/2003 | Klocke et al. ................. 438/49 |
| 2003/0234029 A1 * | 12/2003 | Bergman ....................... 134/1 |
| 2004/0121617 A1 | 6/2004 | Kawano et al. |
| 2004/0180299 A1 * | 9/2004 | Rolland et al. .............. 430/322 |
| 2005/0024609 A1 * | 2/2005 | De Smit et al. ............... 355/18 |
| 2005/0048223 A1 * | 3/2005 | Pawloski et al. ............. 427/600 |
| 2006/0103818 A1 * | 5/2006 | Holmes et al. ................ 355/53 |

FOREIGN PATENT DOCUMENTS

| | | |
|---|---|---|
| JP | 06-168866 | 6/1994 |
| JP | 6168866 A | 6/1994 |
| JP | 7039833 A | 2/1995 |
| JP | 2003289060 A | 10/2003 |
| JP | 2004-078217 | 3/2004 |
| JP | 2004078217 A | 3/2004 |
| JP | 2006-148093 | 6/2006 |

OTHER PUBLICATIONS

Chinese Patent Office, Office Action, Apr. 18, 2004, 5 pages, Application No. 2005100753346.
Decision of Refusal from the Japanese Patent Office for JP2005-337792 dated Sep. 15, 2009, 4 pages (with English translation).

* cited by examiner

*Primary Examiner*—Kathleen Duda
*Assistant Examiner*—Brittany Raymond
(74) *Attorney, Agent, or Firm*—Haynes and Boone, LLP

(57) ABSTRACT

A method comprises forming a photoresist on a substrate, rinsing the photoresist using a rinse liquid agitated with at least one megasonic source, exposing the photoresist to radiation while immersed in a liquid, and developing the photoresist.

18 Claims, 2 Drawing Sheets

IMMERSION PHOTOLITHOGRAPHY WITH MEGASONIC RINSE

BACKGROUND

Photolithography is a process of transferring the pattern of a mask to the photoresist coating the surface of the wafer. Immersion photolithography is a new advance in photolithography which the exposure procedure is performed with a liquid filling the space between the surface of the wafer and the lens. Using immersion photolithography, higher numerical apertures can be built than when using lenses in air, resulting in improved resolution. Further, while smaller device features have less depth of focus, immersion allows a slower loss of depth of focus as we progress toward printing ever smaller features. And since these benefits come without a change in exposure wavelength, existing materials and methodologies can be extended further to smaller feature sizes.

DETAILED DESCRIPTION

The immersion exposure step may use deionized water or another suitable immersion exposure fluid in the space between the wafer and the lens. Though the exposure time is short, the photoresist material may leach into the immersion exposure liquid and cause heretofore unforeseen problems. For example, the photoresist (also referred herein as resist) leached into the immersion exposure liquid may adhere to the lens surface and adversely affect critical dimension uniformity. The resist that adhere to the lens may not be easily removed and may require more frequent equipment maintenance and replacement. The leached resist may comprise photo acid generator (PAG), which would release into the fluid when resist contact to immersion liquid. The leaching (PAG) is thought to be the main reason to cause the lens contamination. Other leaching material like resist polymer, quencher, solvent and outgas would also contaminate the lens and influence the exposure performance. Prior solutions including the use of special top coating materials over the resist can decrease the resist material leaching impact. However, such method increases the overall fabrication time and costs.

Along with the resist leaching into the immersion exposure liquid, another problem is the formation and aggregation of micro-bubbles in the liquid. The adherence of micro-bubbles to the resist during exposure leads to inaccuracies in the transferred image.

Figure 1:
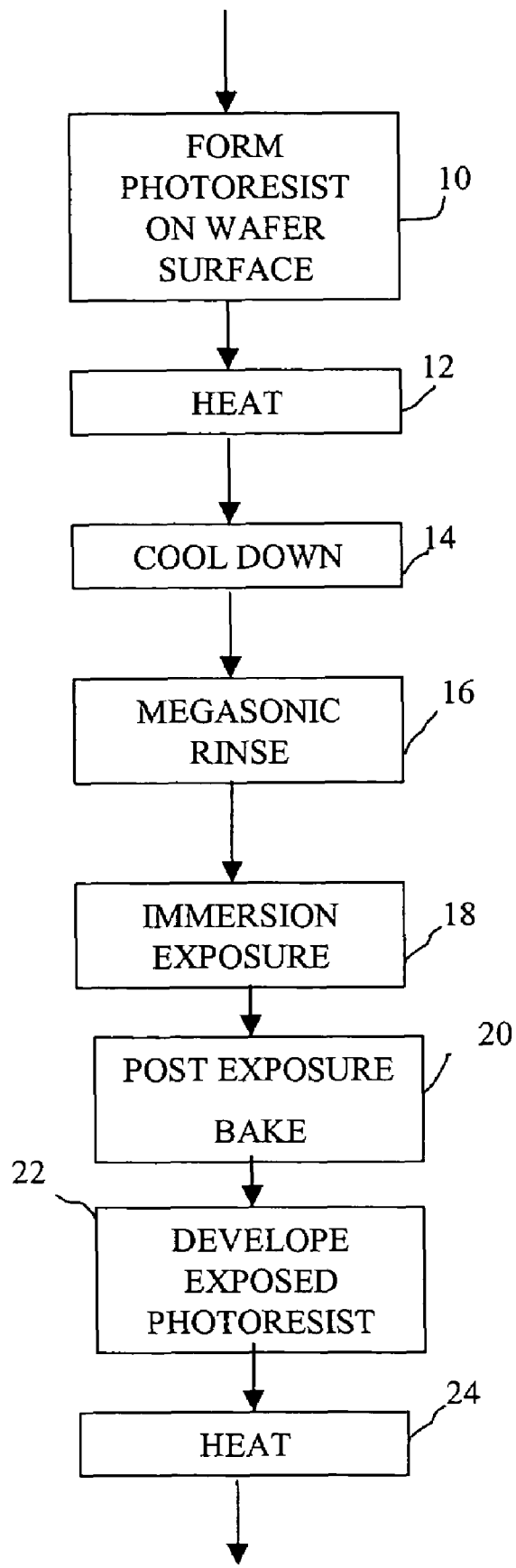
FIG. 1 is a simplified flowchart of an embodiment of an immersion photolithography using megasonic rinse.

Referring to FIG. 1, a simplified flowchart of an embodiment of a process for photolithography is provided. In step 10, a photoresist is formed over the surface of the wafer substrate. The photoresist may be a negative or positive resist and may be of a material now known or later developed for this purpose. For example, the photoresist may be a chemical amplification resist and may be a one- two- or multi-component resist system. The application of the photoresist may be done with spin-coating or another suitable procedure. Prior to the application of the photoresist, the wafer may be first processed to prepare it for the photolithography process. For example, the wafer may be cleaned, dried and/or coated with an adhesion-promoting material prior to the application of the photoresist.

In step 12, the wafer is heated to generally drive off solvents, improve adhesion between the wafer and the photoresist, and anneal away stress that was introduced during the spin process. Step 12 is commonly called the soft bake process, and the wafer is generally heated to about 90 to about 140° C., for example. The wafer may be heated for about 30 to about 200 seconds, for example. Thereafter, the wafer is allowed to cool down in step 14.

In step 16, the wafer is subjected to a megasonic rinse. Megasonic rinse is the use of an oscillating or pulsating liquid at frequencies ranging from about 10 to about 1000 KHz to rinse the wafer. The wafer is immersed in a megasonic-energized liquid bath contained in a tank or subjected to a spray nozzle dispensing the liquid. The megasonic rinse liquid may comprise generally deionized water and may additionally include a surfactant, a polymer and/or a buffer, for example. An example of suitable surfactants includes perflurooctanesulfonate (PFOS); an example of suitable polymer includes C3F8; and an example of suitable buffers includes phosphate. The surfactant may be an ionic or anionic surfactant now known or later developed. One or more megasonic transducers may be used to generate the oscillating energy in the rinse liquid. The megasonic rinse step is operable to remove water-soluble molecules in the resist material to prevent leaching during immersion exposure. The megasonic rinse step is operable to remove the gas in the resist material. The megasonic rinse is also operable to introduce water molecules inside the resist to increase the hydrophilic properties of the resist. The increased hydrophilic property may prevent the formation of micro-bubbles during alignment stage movement, exposure and other pre-exposure equipment activities. Therefore, the megasonic rinse step is operable to remove potential leaching molecules and fill air pockets in the resist that will contaminate the immersion exposure liquid. The megasonic rinse time duration may range between about 5 seconds to about ten minutes, for example. The rinse liquid is dispensed onto the wafer or fed to an immersion bath and drained.

Figure 2:
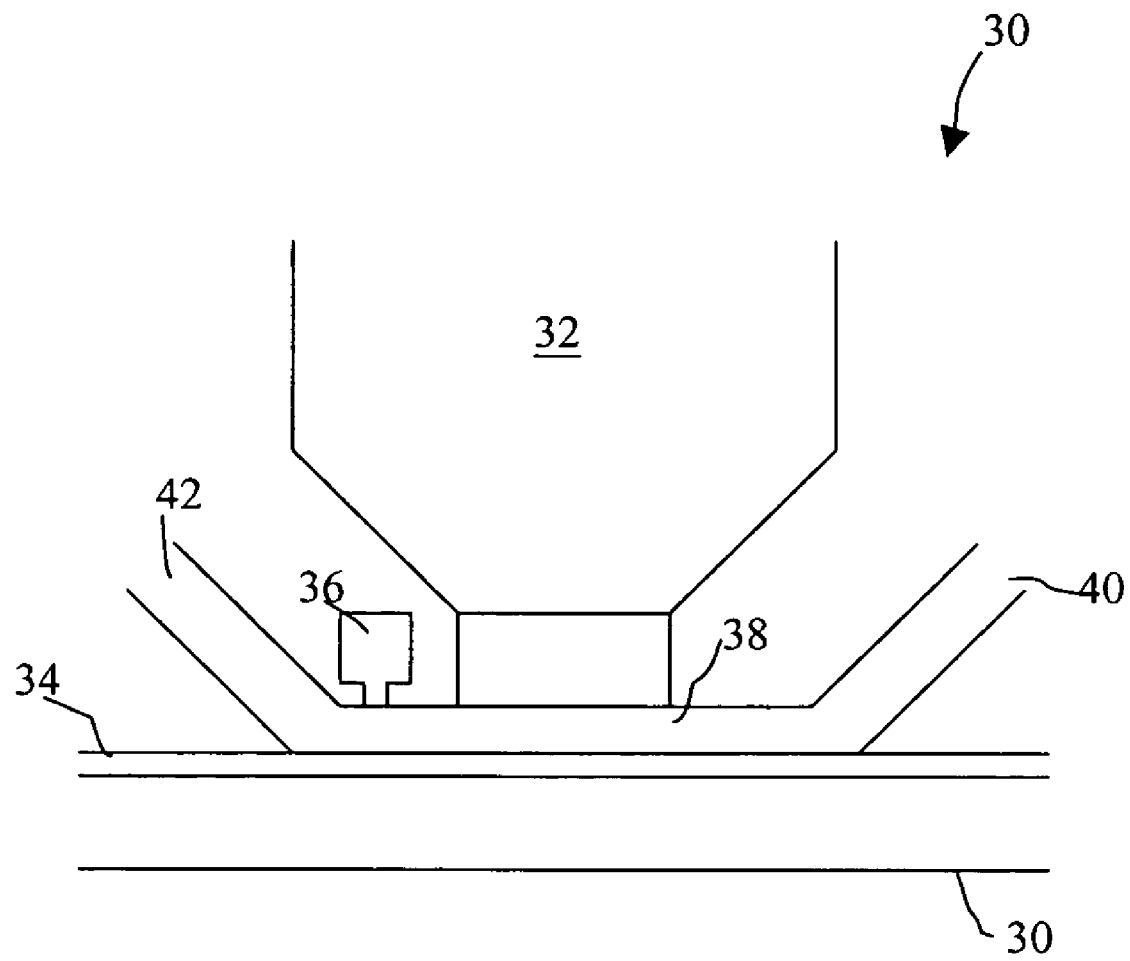
FIG. 2 is a simplified diagram of an embodiment of apparatus for performing immersion photolithography with megasonic rinse.

In one application, the megasonic rinse may be performed in the same chamber that the immersion exposure is performed, such as shown in FIG. 2. Apparatus 30 includes projection optics 32 that is operable to direct radiation onto the wafer 34. One or more megasonic transducers 36 may be turned on for the megasonic rinse step and then off during the immersion exposure step. The megasonic rinse solutions and immersion exposure liquids may be introduced to the interface 38 between the wafer 34 and the optical lens via an inlet 40 and drained via an outlet 42. The inlet 40 may comprise a spray nozzle. A megasonic energy generator is coupled to the spray nozzle. The wafer 34 rests on a wafer stage 44 which may comprise a vacuum chuck to hold the wafer in place. The wafer stage is operable to move or rotate according to the desired rinse and scanning motion. The megasonic rinse step may be followed by one or more additional deionized water rinse steps which may also be performed in apparatus 30. Alternatively, the wafer may be transferred to a tank coupled to a megasonic energy generator for the megasonic rinse step. The immersion solution is energized and agitated by the energy generator to rinse the wafer.

In step 18, the immersion exposure step is performed. The wafer and resist is immersed in an immersion exposure liquid and exposed to a radiation source through a mask. The radiation source may be an ultraviolet light source, for example a krypton fluoride (KrF, 248 nm), argon fluoride (ArF, 193 nm), or $F_2$ (157 nm) excimer laser. The wafer is exposed to the radiation for a predetermined amount of time is dependent on the type of photoresist used, the intensity of the ultraviolet light source, and/or other factors. The exposure time may last from about 0.2 seconds to about 30 seconds, for example.

In step 20, the exposed photo resist is then heated for a post-exposure bake. This step lets the exposed photo acid react with the polymer and make the polymer dissolution. The wafer may be heated to a temperature of about 85 to about 150° C., for example, for about 30 to about 200 seconds, for example. The exposed (positive) or unexposed (negative) photoresist is removed to leave the desired mask pattern. The wafer is immersed in a developer liquid for a predetermined amount of time during which a portion of the photoresist is dissolved and removed. The wafer may be immersed in the developer solution for about 5 to about 60 seconds, for example. The composition of the developer is dependent on the composition of the photoresist.

In step 24, the wafer is then heated for a post-developing hard bake. This step further removes solvents, improve adhesion, and increase the etch resistance of the resist. The wafer may be heated to a temperature of about 90 to about 130° C., for example, for about 30 to about 200 seconds, for example. Thereafter, the wafer with the patterned photoresist may be used to form one or more layers of materials to form device features.

The megasonic rinse step introduced prior to immersion exposure removes resist molecules that are prone to leach into the immersion exposure liquid as well as fill in spaces that may lead to the formation of micro-bubbles during the exposure process. These contaminants in the immersion exposure liquid compromise the exposure process. For example, the resist molecules may adhere to the lens and change the optical performance of the lens, the refractive index of the liquid and jeopardize critical dimension uniformity. The resist adhering to the lens and other hardware may also lead to additional equipment maintenance requirements. The formation of micro-bubbles also would change the refractive index of the liquid and generate erroneous resist image.

What is claimed is:

1. A method comprising:
   forming a photoresist on a substrate;
   rinsing the photoresist using a rinse liquid agitated with at least one megasonic source;
   removing the rinse liquid from the photoresist;
   immersing the photoresist in a second liquid, wherein the second liquid is an immersion exposure liquid, wherein the immersing is performed after the removing the rinse liquid, and wherein the rinsing the photoresist and the immersing the photoresist are performed in a same chamber; and
   exposing the photoresist to radiation while immersed in the immersion exposure liquid, wherein exposing the photoresist occurs subsequent to rinsing the photoresist.

2. The method of claim 1, wherein rinsing the photoresist comprises using an agitated rinse liquid comprising deionized water.

3. The method of claim 1, wherein rinsing the photoresist comprises using an agitated rinse liquid comprising a surfactant.

4. The method of claim 1, wherein rinsing the photoresist comprises using an agitated rinse liquid comprising a buffer.

5. The method of claim 1, wherein rinsing the photoresist comprises using an agitated rinse liquid comprising a polymer.

6. The method of claim 1, wherein rinsing the photoresist comprises using a bath of megasonic-agitated rinse liquid.

7. The method of claim 6, wherein the removing the rinse liquid from the photoresist includes draining the bath.

8. The method of claim 1, wherein rinsing the photoresist comprises using a spray of megasonic-agitated rinse liquid.

9. The method of claim 8, wherein the removing the rinse liquid from the photoresist includes stopping the spray of megasonic-agitated rinse liquid.

10. The method of claim 1, wherein rinsing the photoresist comprises using at least one megasonic transducer with a frequency range between about 10 to about 1000 KHz.

11. The method of claim 1, further comprising heating the substrate and the photoresist prior to rinsing the photoresist using megasonic-agitated liquid.

12. The method of claim 1, further comprising rinsing the photoresist with deionized water after rinsing the photoresist using megasonic-agitated liquid and prior to exposing the photoresist.

13. The method of claim 1, further comprising:
    developing the photoresist; and
    heating the substrate and the developed photoresist.

14. The method of claim 1, wherein rinsing the photoresist comprises immersing the photoresist in a bath of megasonic-agitated rinse liquid.

15. The method of claim 1, wherein rinsing the photoresist comprises using a spray of megasonic-agitated rinse liquid.

16. The method of claim 1, wherein rinsing the photoresist and exposing the photoresist is performed in a single chamber.

17. The method of claim 1, wherein the removing the rinse liquid from the photoresist includes removing water-soluble molecules from the photoresist.

18. A method comprising:
    forming a photoresist on a semiconductor wafer;
    soft baking the photoresist;
    rinsing the photoresist using a liquid comprising surfactant water, wherein the surfactant water is megasonically-agitated during the rinsing of the photoresist;
    removing the surfactant water from the wafer following the rinsing of the photoresist; and
    exposing the rinsed photoresist to radiation while immersed in an immersion exposure liquid, wherein the rinsing the photoresist is performed prior to the exposing the photoresist and wherein the exposing provides a patterned photoresist used to form a semiconductor device feature, and wherein the rinsing the photoresist and the exposing the rinsed photoresist occur in a same chamber.

* * * * *